United States Patent
Kennedy et al.

(10) Patent No.: US 9,611,543 B2
(45) Date of Patent: Apr. 4, 2017

(54) SLIDING ELEMENT HAVING A COATING

(75) Inventors: Marcus Kennedy, Dusseldorf (DE); Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 32 days.

(21) Appl. No.: 13/390,238

(22) PCT Filed: May 11, 2010

(86) PCT No.: PCT/EP2010/056439
§ 371 (c)(1),
(2), (4) Date: Apr. 30, 2012

(87) PCT Pub. No.: WO2011/018252
PCT Pub. Date: Feb. 17, 2011

(65) Prior Publication Data
US 2012/0205875 A1 Aug. 16, 2012

(30) Foreign Application Priority Data
Aug. 13, 2009 (DE) .......... 10 2009 028 504

(51) Int. Cl.
*F16J 9/26* (2006.01)
*C23C 16/02* (2006.01)
(Continued)

(52) U.S. Cl.
CPC .......... *C23C 16/0281* (2013.01); *C23C 16/26* (2013.01); *C23C 16/30* (2013.01); *C23C 28/04* (2013.01); *C23C 30/005* (2013.01)

(58) Field of Classification Search
USPC .......... 277/440–444; 428/833.2, 835
See application file for complete search history.

(56) References Cited

U.S. PATENT DOCUMENTS 5,366,298 A * 11/1994 Toshimitsu et al. .......... 384/107
5,941,647 A 8/1999 Koike et al.
(Continued)

FOREIGN PATENT DOCUMENTS

DE 19735962A1 A1 3/1998
DE 10203730 A1 8/2003
(Continued)

OTHER PUBLICATIONS

A. Hieke et al."Comparison Between WCC/DLC, CrN/DLC and RF Produced DLC Coatings", 2005 Society of Vacuum Coaters, 48th Annual Technical Conference Proceedings (2005), pp. 556 to 561.
(Continued)

*Primary Examiner* — Kristina Fulton
*Assistant Examiner* — Eugene G Byrd
(74) *Attorney, Agent, or Firm* — Robert L. Stearns; Dickinson Wright, PLLC

(57) ABSTRACT

The invention relates to a sliding element, such as a piston ring, having a coating on at least one running surface, which comprises, from the inside out, an adhesive layer (10), a metal-containing, preferably tungsten-containing, DLC layer (12), and a metal-free DLC layer (14), and is characterized in that the ratio of the thickness of the metal-free DLC layer to the thickness of the metal-containing DLC layer ranges from 0.7 to 1.5 and/or to the overall thickness of the coating ranges from 0.4 to 0.6.

16 Claims, 3 Drawing Sheets

(51) Int. Cl.
*C23C 16/26* (2006.01)
*C23C 16/30* (2006.01)
*C23C 28/04* (2006.01)
*C23C 30/00* (2006.01)

(56) References Cited

U.S. PATENT DOCUMENTS

| | | | |
|---|---|---|---|
| 6,056,443 A * | 5/2000 | Koike et al. | 384/296 |
| 6,139,022 A * | 10/2000 | Iwashita et al. | 277/443 |
| 6,142,481 A * | 11/2000 | Iwashita et al. | 277/443 |
| 6,177,754 B1 * | 1/2001 | Suzuki et al. | 310/323.09 |
| 6,279,913 B1 * | 8/2001 | Iwashita et al. | 277/442 |
| 6,325,385 B1 * | 12/2001 | Iwashita et al. | 277/442 |
| 6,716,540 B2 * | 4/2004 | Akari et al. | 428/634 |
| 7,160,616 B2 * | 1/2007 | Massler et al. | 428/408 |
| 7,169,473 B2 * | 1/2007 | Murakami et al. | 428/408 |
| 7,244,493 B2 * | 7/2007 | LaBarge et al. | 428/336 |
| 7,255,084 B2 * | 8/2007 | Savale et al. | 123/193.6 |
| 7,947,372 B2 * | 5/2011 | Dekempeneer | 428/408 |
| 8,033,550 B2 * | 10/2011 | Jacquet et al. | 277/442 |
| 8,119,240 B2 * | 2/2012 | Cooper | 428/408 |
| 8,123,227 B2 * | 2/2012 | Kawanishi et al. | 277/442 |
| 8,206,035 B2 * | 6/2012 | Martin et al. | 384/13 |
| 8,251,373 B2 * | 8/2012 | Lev et al. | 277/647 |
| 8,430,410 B2 * | 4/2013 | Esser et al. | 277/442 |
| 2001/0024737 A1 * | 9/2001 | Utsumi et al. | 428/651 |
| 2001/0046835 A1 * | 11/2001 | Wielonski et al. | 451/533 |
| 2004/0119242 A1 * | 6/2004 | Katumaru et al. | 277/440 |
| 2004/0261866 A1 * | 12/2004 | Suzuki et al. | 137/630.15 |
| 2005/0255338 A1 * | 11/2005 | Ohchi | 428/833.2 |
| 2006/0207540 A1 * | 9/2006 | Matsui et al. | 123/90.49 |
| 2006/0269796 A1 * | 11/2006 | Hyodo | 428/833.2 |
| 2007/0059529 A1 * | 3/2007 | Hosenfeldt | C23C 14/0605 428/408 |
| 2008/0166287 A1 | 7/2008 | Venkatraman et al. | |
| 2009/0001669 A1 * | 1/2009 | Hoppe et al. | 277/442 |
| 2011/0101620 A1 | 5/2011 | Hoppe et al. | |

FOREIGN PATENT DOCUMENTS

| | | |
|---|---|---|
| DE | 102004043550 A1 | 3/2006 |
| DE | 102006004750 A1 | 10/2006 |
| DE | 102005063123 B3 | 5/2007 |
| DE | 102006029415 A1 | 1/2008 |
| DE | 19944977 B4 | 6/2008 |
| DE | 102007018716 A1 | 10/2008 |
| DE | 102007054181 A1 | 5/2009 |
| DE | 102008016864B3 B3 | 10/2009 |
| EP | 1760172 A2 | 3/2007 |
| EP | 1767662 A2 | 3/2007 |
| JP | 2000128516 A | 5/2000 |
| WO | WO2006125683A1 A1 | 11/2006 |
| WO | WO 2007064332 A1 * | 6/2007 |

OTHER PUBLICATIONS

A. Hieke et al.., "Multifunctional Amorphous Carbon Based Coatings", 2001 Society of Vacuum Coaters, 44th Annual Technical Conference Proceedings, Philadelphia, Apr. 21-26, 2001, pp. 63 to 66.

Jahrbuch Oberflachentechnik 2008 [Yearbook of surface technology 2008], vol. 64, Publisher: Dr.-Ing. Richard Suchentrunk, Eugen G. Leuze Verlag, May 2008, pp. 178 to 184.

Excerpt from the following web page (with respect to Jahrbuch Oberflächentechnik 2008): https://ssl.kundenserver.de/www.leuze-verlag-shop.de/sess/utn;jsessionid=154d9b 0561a44a5/bs_shopdata/0030_Fachb=FCcher +Galvanotechnik/1020_Jahrbuch+Oberfl=E4chentechnik/product_details.shopscript?article=0040_Jahrbuch%2BOberfl%3DE4 chentechnik%2B2006%3D2C%2BBand%2B62%2B%3D 28ISBN%2B3-87480-222-1%3D29.

G. Van Der Kolk, "Expected developments of PVD and PACVD coatings for components", Opening Lecture, Sep. 11, 2006, Tenth International Conference on Plasma Surface Engineering, Conference and Exhibition, Abstracts, PSE 2006, Sep. 10-16, 2006, Garmisch-Partenkirchen, Germany.

"Time Schedule" of the Tenth International Conference on Plasma Surface Engineering, Conference and Exhibition, Sep. 11, 2006.

The set of slides presented in the "Expected developments of PVD and PACVD coatings for components" lecture, Dr. Gerry van der Kolk.

Delivery note dated Jan. 25, 2006 with regard to a coated plunger delivered to Delphi Diesel Systems Ltd., Gloucestershire, Great Britain.

Experiment results of thickness tests on the coatings of a coated plunger delivered to Delphi Diesel Systems Ltd., Gloucestershire, Great Britain.

Delivery note dated Jun. 30, 2006 with regard to a coated bushing delivered to Volkswagen AG Salzgitter, Germany.

Experiment results of thickness tests on the coatings of a coated bushing delivered to Volkswagen AG Salzgitter, Germany.

C. Strondl et al., "Properties and characterization of multilayers of carbides and diamond-like carbon", Surface and Coating Technology, 142-144 (2001), 707-713.

Translation of the relevant parts of a Notice of Opposition as submitted to the German Patent and Trademark Office by Schaeffler Technologies GmbH & Co. KG, dated Apr. 12, 2011.

Translation of the relevant parts of a Notice of Opposition as submitted to the German Patent and Trademark Office by the law firm Manitz, Finsterwald & Partner, dated Apr. 12, 2011.

Translation of the relevant parts of a Notice of Opposition as submitted to the German Patent and Trademark Office by the law firm Winter Lewandowsky, dated Apr. 12, 2011.

International Search Report PCT/EP2010/056439 mailed Aug. 31, 2010.

Information Institute of the Third Design and Research Institute of the Electrical and Mechanical Department of the Materials and Processes Division of the China Institute of Internal Combustion Engines, "World internal-combustion engine materials and technology advances", Oct. 1991, Book registration No. Chongqing internal (92)050.

* cited by examiner

SLIDING ELEMENT HAVING A COATING

BACKGROUND OF THE INVENTION

1. Technical Field

The invention relates to a sliding element, in particular a piston ring, having a coating on at least one running surface.

2. Related Art

Sliding elements such as, for example, piston rings, pistons or cylinder sleeves in internal combustion engines must work over a long service life, both with as little friction as possible and with only a low level of wear. It is the case that the friction, which is directly associated with the fuel consumption in the case of internal combustion engines, can be kept to a low level by coatings of DLC (diamond-like carbon). Further, layer thicknesses of up to 40 µm can be achieved in principle. Nevertheless, in the case of layer thicknesses of more than 5 µm, there is the problem that the layer properties alter, for example in respect of the structure and composition of the layer, such that the required service life is not achieved. This applies likewise to layer thickness of less than 5 µm.

Also known in this connection are PVD coatings based on a hard material, which comprise at least chromium nitride. Although such layers do have the necessary resistance to wear, they nevertheless do not have the required low coefficients of friction.

A sliding element having a DLC coating with a good running-in behaviour is known from DE 10 2005 063 123 B3. Overall, however, the durability of a low coefficient of friction could be improved further.

DE 10 2008 016 864 relates to a sliding element having a coating that comprises, from the inside outwards, an adhesive layer, a metal-containing DLC layer, and a metal-free DLC layer.

DE 197 35 962 A1 discloses a guide bush and a method for realising a hard carbon film on the inner surface of the guide bush, wherein a plasma CVD process is used to realise a hard carbon film of hydrogenated amorphous carbon on the inner surface.

Finally, WO 2006/125683 A1 discloses a piston ring comprising, from the inside outwards, a layer comprising an element of the groups IVB, VB or VIB, an intermediate layer comprising a diamond-like nanocomposite composition, and a DLC layer.

SUMMARY OF THE INVENTION

Against this background, the invention is based on the object of providing a sliding element that is improved further in respect of the combination of coefficient of friction and wear properties.

Accordingly, this sliding element has, on at least one running surface, a coating that, from the inside outwards, comprises an adhesive layer, a DLC layer containing metal, in particular tungsten, and a metal-free DLC layer, the ratio of the thickness between the metal-free DLC layer and that containing metal being between 0.7 and 1.5, and/or the ratio of the thicknesses between the metal-free DLC layer and the coating as a whole being between 0.4 and 0.6. The adhesive layer is preferably a chromium adhesive layer. The DLC layer containing metal comprises amorphous carbon, and can be designated by a-C:H:Me and, as the preferred DLC layer containing tungsten, can be designated as a-C:H:W. The outermost, or top, layer likewise comprises amorphous carbon, and can be denoted by a-C:H. Particularly good properties in respect of friction and wear were ascertained in the case of the values described. These tribological properties can be influenced, towards a longer service life, by a thicker top layer. If this top layer becomes too thick in comparison with the middle layer, however, the wear values become worse. It was possible to ascertain particularly good wear values if the middle and the top layer are of a virtually identical thickness, such that a thickness ratio of approximately 1.0, in particular 0.9 to 1.1, or a thickness ratio of the top layer to the total layer of approximately 0.5, in particular 0.45 to 0.55, is preferred here. In respect of the friction, for coatings within the said ranges it was possible to ascertain coefficients of friction that satisfactorily meet the demands arising in an internal combustion engine and that, in particular, are largely constant. Outside these ranges, by contrast, high friction coefficient peaks and a non-constant friction characteristic were ascertained even after a short period of time.

As an explanation for this behaviour, to which, however, the invention is not limited, it is at present considered that the metal-free DLC layer first introduces into the overall system, i.e. into the coating as a whole, very high internal stresses that, in the case of the metal-containing DLC layer being of a layer thickness similar to the thickness of the outermost layer, can be compensated in such a way that the coating is realised in an optimal manner with regard to the combination between strength and toughness. A sliding element coated therewith, in particular a piston ring, thus has a good resistance to wear. If the layer thickness ratio between the metal-free and the metal-containing DLC layer is <0.7, and/or if the ratio of the layer thickness of the top layer to that of the total layer is <0.4, the service life of the sliding element is too short, since the outermost, metal-free DLC layer, while having a high resistance to wear, is nevertheless of an insufficient layer thickness. In contrast to this, if the layer thickness ratio between the metal-free and the metal-containing DLC layer is >1.5, and/or if the ratio of the thickness of the top layer to that of the total layer is >0.6, the thickness of the metal-containing DLC layer is not sufficient to compensate the internal stresses. This results in premature wear of the DLC layer as a whole, despite the great thickness of the outermost layer, or in flaking-off of the DLC layer, as a result of excessively high loads during operation.

While the coating is realised, at least partially, on at least one running surface of the sliding element, it can extend over the entire running surface and, in particular, can also be realised, wholly or partially, on surfaces that adjoin the running surfaces, such as, for example, the flanks of a piston ring and/or at the transition from the running surface to the surfaces adjoining the latter.

At present, cast iron or steel is preferred as a base material of the sliding element, in particular of the piston ring. It was possible to ascertain particularly good properties for these materials.

In respect of the hardness of the layer, values of 1700 HV0.02 to 2900 HV0.02 are preferred for the metal-free (a-C:H-, top-) DLC layer, and/or of 800 to 1600 HV0.02 for the metal-containing (a-C:H:Me-) DLC layer, since the requirements were met satisfactorily with these values.

Both the metal-containing and the metal-free DLC layer can contain hydrogen, this having proved advantageous in tests.

Further, for the DLC layer containing tungsten, it is preferred that it contain nanocrystalline tungsten carbide precipitates, whereby the properties are further enhanced.

For the thickness of the adhesive layer, which, in particular, is a chromium adhesive layer, a value of maximally 1 μm is preferred.

A total coating thickness of 5 μm to 40 μm is preferred so that the described balance between the coefficient of friction and the wear properties can be achieved in a particularly satisfactory manner.

In respect of efficient realisation of the coating, it is at present preferred that the adhesive layer be effected by metal vapour deposition.

Favourable production of the coating according to the invention is further ensured, in respect of the metal-containing and/or metal-free DLC layer, if these layers are realised by means of a PA-CVD process.

BRIEF DESCRIPTION OF THE DRAWINGS

Preferred exemplary embodiments of the invention are explained more fully in the following with reference to the drawings, wherein.

DETAILED DESCRIPTION OF PREFERRED EMBODIMENTS OF THE INVENTION

Figure 1:
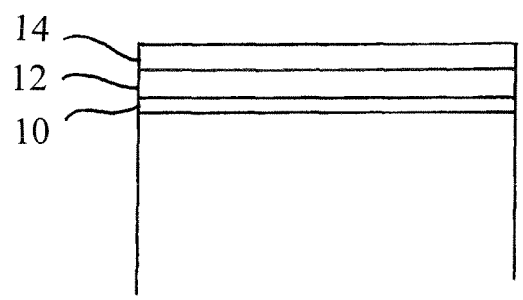
FIG. 1 shows, schematically, the structure of the coating according to the invention.

As represented schematically in FIG. 1, the coating according to the invention comprises, from the inside outwards, an adhesive layer 10, a middle layer 12 and a top layer 14, the thicknesses and thickness ratios of which are within the range stated above.

Examples

The properties of the coating according to the invention were investigated on the basis of two examples and one comparative example. Tests were performed with the following coatings:

|  | Example | | |
| --- | --- | --- | --- |
|  | 1 | 2 | 3 |
| Ratio of middle layer/top layer | 0.71 | 2.40 | 1.08 |
| Proportion of top layer relative to total layer | 0.42 | 0.71 | 0.52 |

Figure 2:
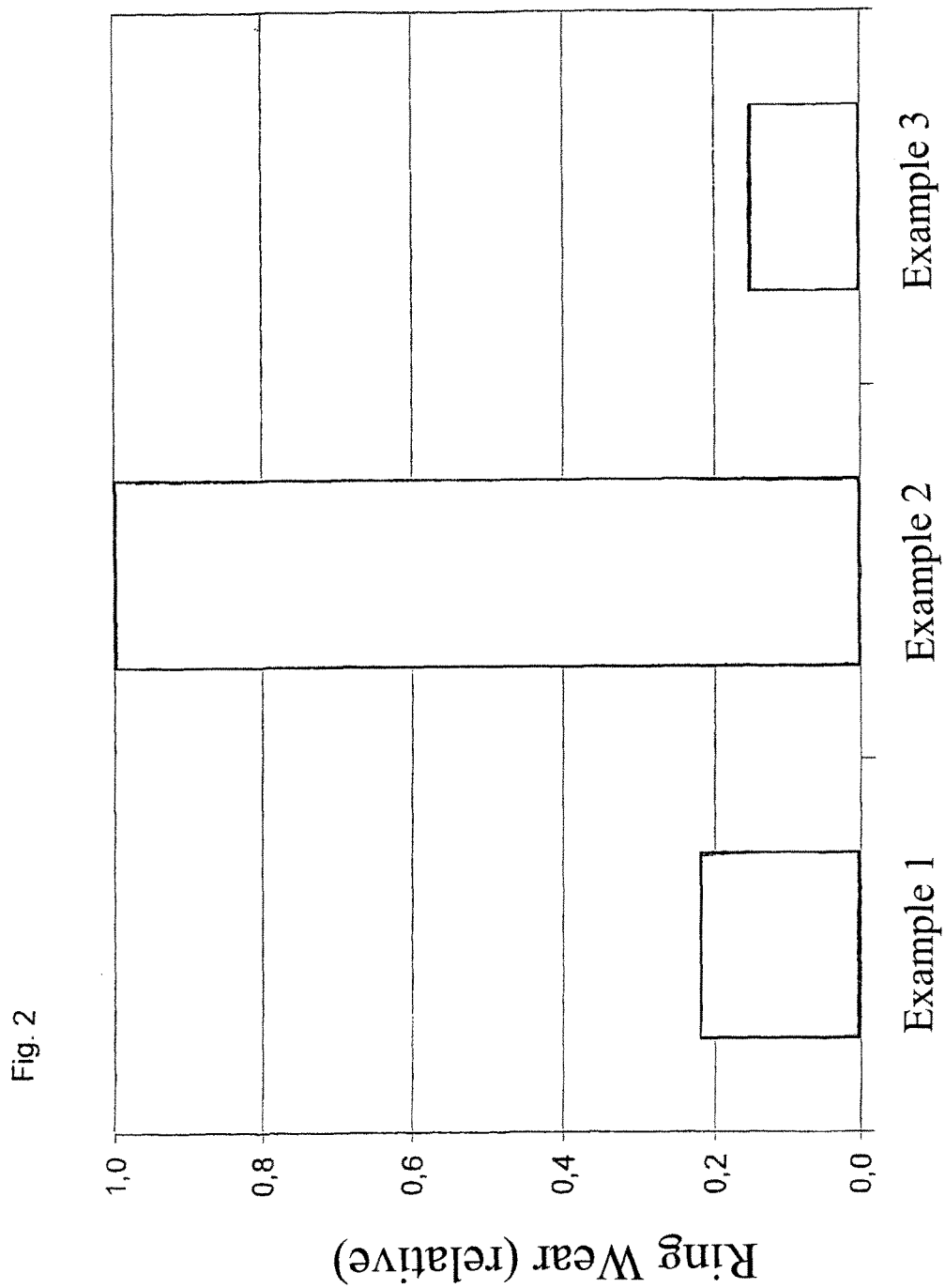
FIG. 2 shows a representation of the relative wear in the case of two examples according to the invention and one comparative example.

Examples 1 and 3 in this case are examples according to the invention, and Example 2 is a comparative example. The studies were performed for the system "piston ring/honed grey cast iron cylinder sleeve, lubricated". FIG. 2 shows the relative wear values of the piston rings. As can be seen from FIG. 2, the examples according to the invention have a significantly lesser wear than the comparative example 2, in particular approximately only 20%, or less, of the wear occurring in the case of the comparative example 2.

Figure 3:
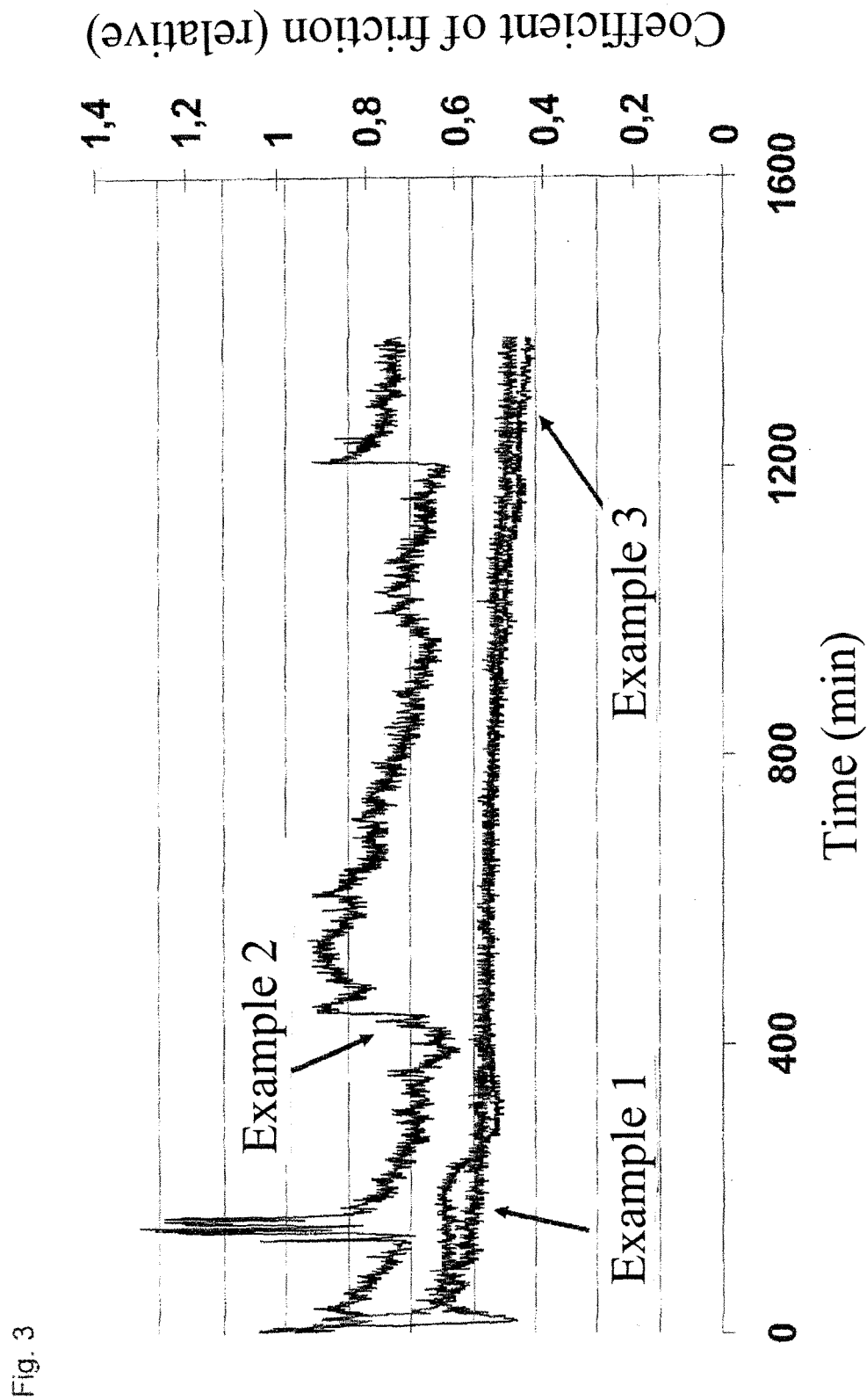
FIG. 3 a representation of the relative coefficient of friction in the case of two examples according to the invention and one comparative example.

As shown by FIG. 3, in the case of the examples according to the invention, moreover, the coefficient of friction is largely constant over time, whereas, in the case of the comparative example, on the one hand, the coefficient of friction is higher, and has very high peak values, over the entire course. On the other hand, the coefficient of friction fluctuates extensively. Further, the coating according to this comparative example can be said to have failed before completion of the test period.

The invention claimed is:

1. A piston ring having at least one radially outwardly facing running surface and a coating forming said at least one running surface and extending from an inside region adjacent said running surface to a radially outward free region, said coating comprising, from the inside radially outwards, an adhesive layer, a DLC layer containing metal, and a metal-free DLC layer all having predetermined thicknesses, wherein the thickness of the metal-free DLC layer in relation to the thickness of the metal-containing DLC layer has a ratio of 0.7 to 1.5, wherein the total coating thickness is 5 μm to 40 μm, and wherein the DLC layer containing metal has a hardness of 800-1600 HV0.02.

2. The piston ring according to claim 1, wherein the piston ring has cast iron or steel as a base material.

3. The piston ring according to claim 1, wherein the metal-free DLC layer has a hardness of 1700 HV0.02 to 2900 HV0.02.

4. The piston ring according to claim 1, wherein, the metal-containing DLC layer contains hydrogen.

5. The piston ring according to claim 1, wherein the adhesive layer has a thickness of maximally 1 μm.

6. The piston ring according to claim 1, wherein the adhesive layer is formed by metal vapour deposition.

7. The piston ring according to claim 1, wherein at least one of the DLC layers is fabricated by means of PA-CVD processes.

8. The piston ring of claim 1 wherein said metal of said metal-containing DLC layer comprises tungsten.

9. The piston ring of claim 1 wherein the thickness of the metal-free DLC layer in relation to the total thickness of the coating has a ratio of 0.4 to 0.6.

10. The piston ring of claim 4 wherein the metal-free DLC layer contains hydrogen.

11. The piston ring of claim 5 wherein the adhesive layer is a chromium adhesive layer.

12. The piston ring according to claim 8, wherein the DLC layer containing tungsten contains nanocrystalline tungsten carbide precipitates.

13. A piston ring having at least one radially outwardly facing running surface and a coating forming said at least one running surface and extending from an inside region adjacent said running surface to a radially outward free region of said running surface, said coating comprising, from the inside outwards, an adhesive layer, a DLC layer containing metal, and a metal-free DLC layer all having predetermined thicknesses, wherein the thickness of the metal-free DLC layer has a ratio of 0.4 to 0.6 in relation to the total coating thickness, wherein the total coating thickness is 5 μm to 40 μm, and wherein the DLC layer containing metal has a hardness of 800-1600 HV0.02.

14. The piston ring of claim 13, wherein the metal-free DLC layer has a hardness of 1700 HV0.02 to 2900 HV0.02.

15. The piston ring of claim 14, wherein the metal-containing DLC layer has a hardness of 800-1600 HV0.02.

16. The piston ring of claim 1 wherein the thickness of the metal-free DLC layer in relation to the thickness of the metal-containing DLC layer has a ratio of 0.9 to 1.1.

* * * * *